(12) United States Patent
Tseng et al.

(10) Patent No.: US 11,929,587 B2
(45) Date of Patent: Mar. 12, 2024

(54) DUAL-WAVELENGTH GUN AIMING COLLIMATED BEAM LIGHT SOURCE MODULE

(71) Applicant: ARIMA LASERS CORP., Taoyuan (TW)

(72) Inventors: Cheng-Tsung Tseng, Taoyuan (TW); Ming-Hui Fang, Taoyuan (TW)

(73) Assignee: Arima Lasers Corp., Taoyuan (TW)

( * ) Notice: Subject to any disclaimer, the term of this patent is extended or adjusted under 35 U.S.C. 154(b) by 177 days.

(21) Appl. No.: 17/496,029

(22) Filed: Oct. 7, 2021

(65) Prior Publication Data

US 2023/0116723 A1   Apr. 13, 2023

(51) Int. Cl.
*H01S 3/08* (2023.01)
*F41G 1/35* (2006.01)
*G02B 27/09* (2006.01)
*H01S 3/00* (2006.01)
*H01S 5/40* (2006.01)

(52) U.S. Cl.
CPC .............. *H01S 3/0809* (2013.01); *F41G 1/35* (2013.01); *G02B 27/0955* (2013.01); *H01S 3/0071* (2013.01); *H01S 5/4012* (2013.01)

(58) Field of Classification Search
CPC .. H01S 3/0809; H01S 3/0071; H01S 5/02212; H01S 5/4012; G02B 27/0955; F41G 1/35
See application file for complete search history.

(56) References Cited

U.S. PATENT DOCUMENTS

| | | | | |
|---|---|---|---|---|
| 5,351,429 A * | 10/1994 | Ford | ........................ | F41G 1/35 362/110 |
| 6,431,731 B1 * | 8/2002 | Krietzman | .............. | H01S 3/005 362/246 |
| 2005/0117329 A1 * | 6/2005 | Lin | ........................ | G02B 27/20 362/118 |
| 2007/0263683 A1 * | 11/2007 | Nakahata | ............... | G02B 5/005 372/29.014 |
| 2009/0274176 A1 * | 11/2009 | O'Shaughnessy | .... | H01S 3/2383 372/99 |
| 2012/0105812 A1 * | 5/2012 | Dekker | ................ | H04N 9/3129 353/121 |
| 2017/0184374 A1 * | 6/2017 | Kowalczyk, Jr. | ......... | F41G 1/35 |

* cited by examiner

*Primary Examiner* — Xinning(Tom) Niu
(74) *Attorney, Agent, or Firm* — Rosenberg, Klein & Lee

(57) ABSTRACT

A dual-wavelength gun aiming collimated beam light source module, comprising: a positioning seat, having a first through hole and a second through hole inside; a first laser module for emitting laser light of first wavelength; a second laser module for emitting laser light of second wavelength; a first reflecting mirror, and the inner surface of the first reflecting mirror has a first wavelength laser light high-reflection coating; and a second reflecting mirror, and the outer surface of the second reflecting mirror has a first wavelength laser light high-reflection coating and a second wavelength laser light high-reflection coating; so as to solve the aiming deviation problem.

3 Claims, 5 Drawing Sheets

DUAL-WAVELENGTH GUN AIMING COLLIMATED BEAM LIGHT SOURCE MODULE

BACKGROUND OF THE INVENTION

1. Field of the Invention

The present invention relates to a dual-wavelength gun aiming collimated beam light source module, particularly to one that has a first wavelength passes through the reflection of the first reflecting mirror and the second reflecting mirror, it coincides with the optical path of the laser light of the second wavelength which penetrating the second reflecting mirror.

2. Description of the Related Art

The conventional gun aiming collimated beam light source module is a single-wavelength design, and can be divided into visible light (such as green light) gun aiming collimated beam light source module suitable for daytime use, and invisible light (such as infrared) gun aiming collimated beam light source module suitable for night use. The light source module causes the user to prepare two different wavelengths of the gun aiming collimated beam light source module, so that the gun aiming collimated beam light source module with suitable wavelength can be selected; therefore, as shown in FIG. 1, someone designed a gun aiming collimated beam light source module 10 with dual-wavelength collimated light sources 11a, 11b in parallel, which is convenient for users to switch and select collimated light sources with suitable wavelengths at the right time. However, the dual-wavelength collimated light sources have different aiming point due to the parallel arrangement, which causes to the problem of aiming deviation.

SUMMARY OF THE INVENTION

A primary objective of the present invention is solve the aiming deviation problem.

Another objective of the present invention is to achieve light blending.

Yet another objective of the present invention is to adjust optical path.

To achieve the objects mentioned above, the present invention comprises a positioning seat, having a first through hole and a second through hole inside; a first laser module, arranged inside the first through hole of the positioning seat for emitting laser light of first wavelength; a second laser module, arranged inside the second through hole of the positioning seat for emitting laser light of second wavelength; a first reflecting mirror, arranged on the positioning seat obliquely with respect to the first laser module, and the inner surface of the first reflecting mirror with respect to the first laser module has a first wavelength laser light high-reflection coating; and a second reflecting mirror, arranged on the positioning seat obliquely with respect to the second laser module and the first reflecting mirror, and the outer surface of the second reflecting mirror with respect to the second laser module has a first wavelength laser light high-reflection coating and a second wavelength laser light anti-reflection coating.

Also, the first laser module is provided with a first collimating lens and a first wavelength laser diode inside a first tubular body; the second laser module is provided with a second collimating lens and a second wavelength laser diode inside a second tubular body, wherein the first tubular body has a first ball unit, the first through hole has a first ball and socket unit relative to the first ball unit, and a first fixing ring is used to fix the first tubular body to the first through hole; The second tubular body has a second ball unit, the second through hole has a second ball and socket unit relative to the second ball unit, and a second fixing ring is used to fix the second tubular body to the inside the second through hole.

Also, the positioning seat is combined with a front cap and a rear cap, wherein the front cap having a dust mirror.

Whereby after the laser light of the first wavelength passes through the reflection of the first reflecting mirror and the second reflecting mirror, it coincides with the optical path of the laser light of the second wavelength which penetrating the second reflecting mirror.

DETAILED DESCRIPTION OF THE PREFERRED EMBODIMENT

Figure 1:
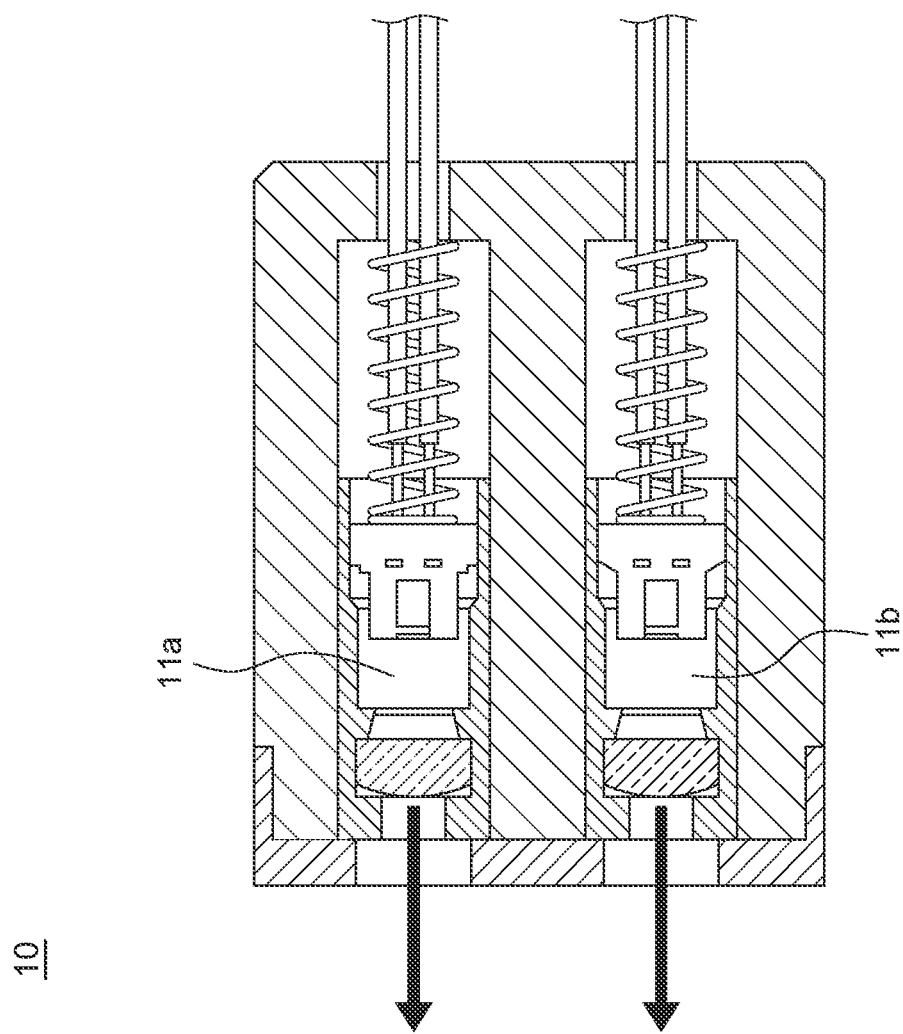
FIG. 1 is a schematic diagram illustrating arrangement of the dual-wavelength gun aiming collimated beam light source module of the prior art.
Figure 2:
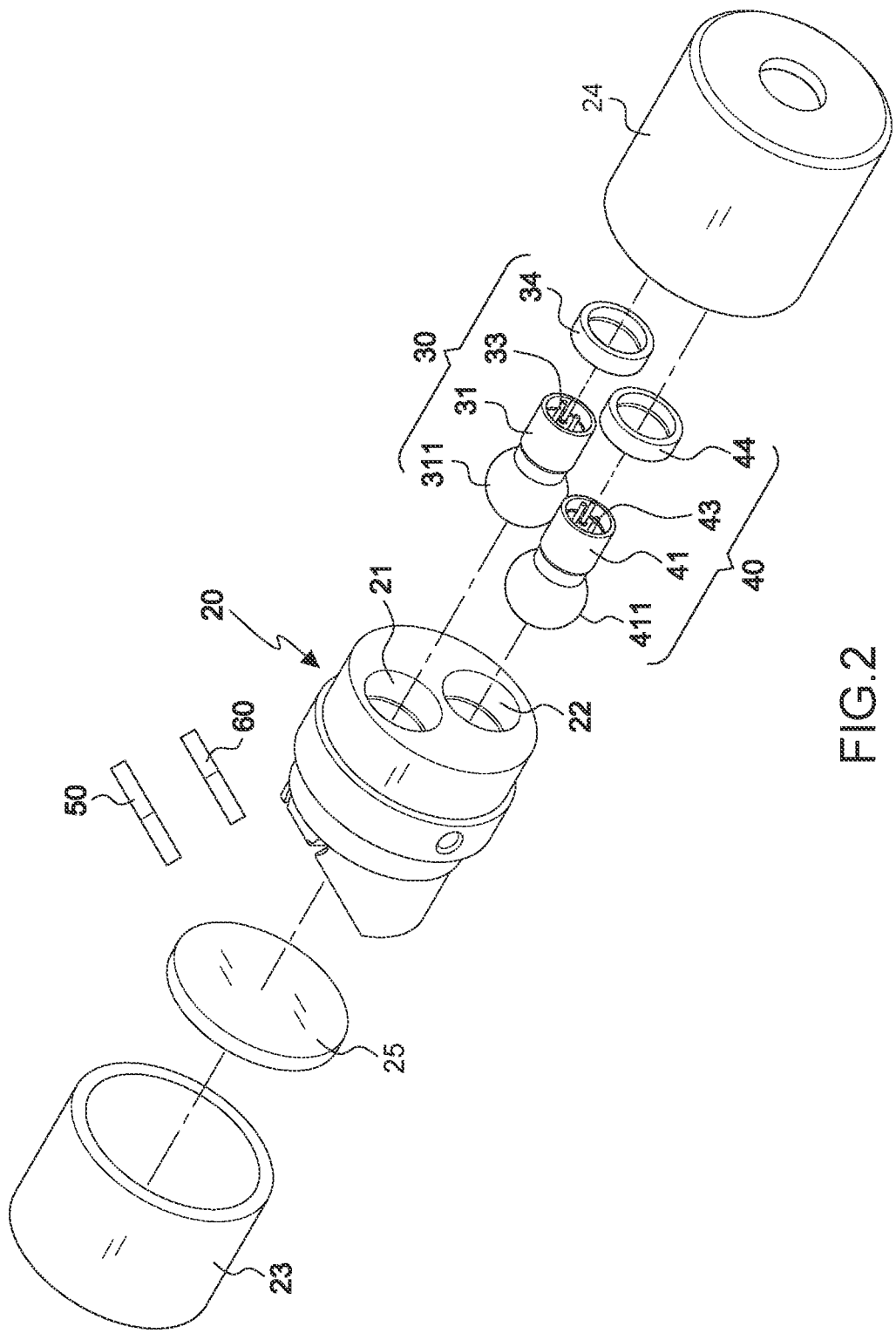
FIG. 2 is a prospective view of the present invention.
Figure 3:
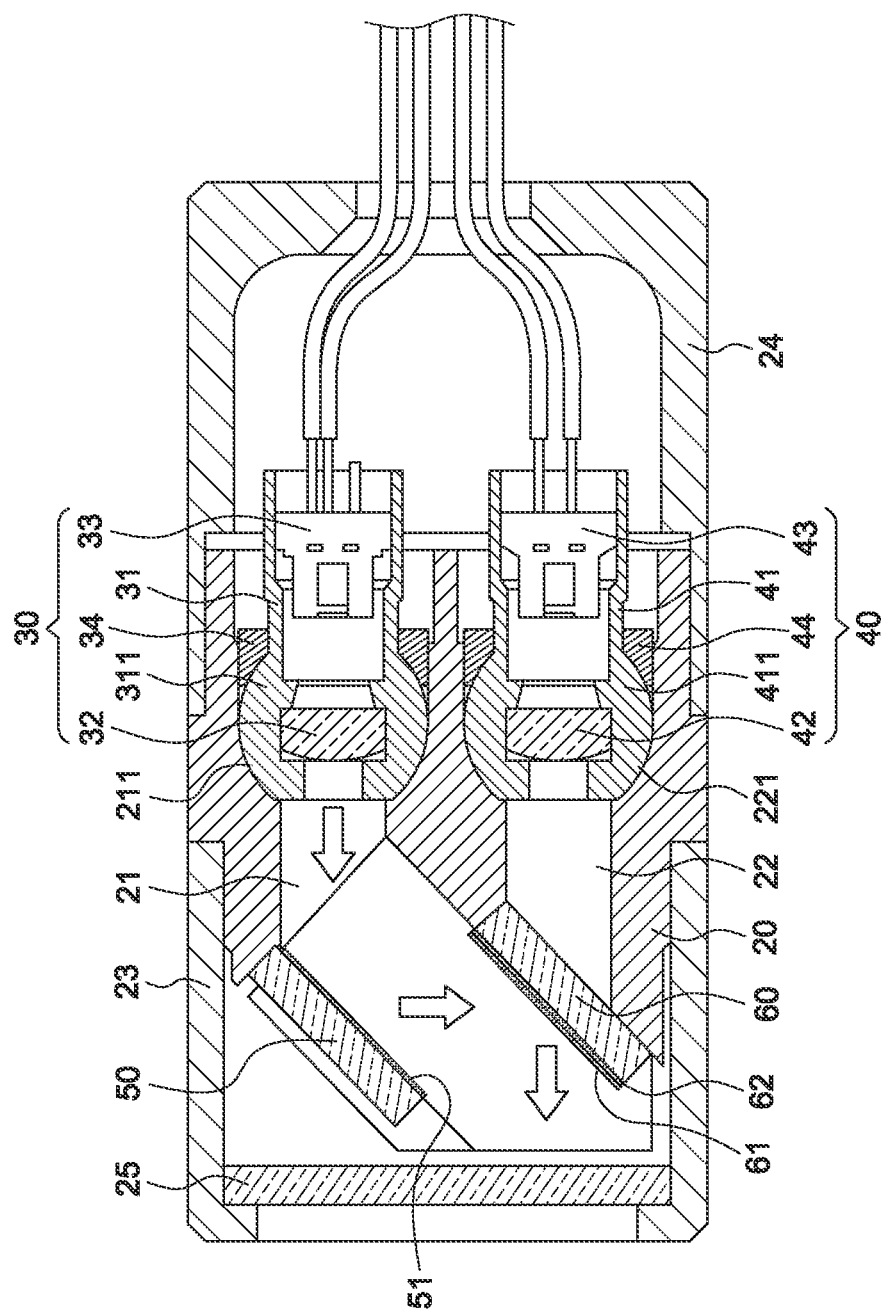
FIG. 3 is the sectional view of the structure of the optical path of the first wavelength of the present invention.

Referring to FIGS. 2~3, the present invention includes: a positioning seat 20, having a first through hole 21 and a second through hole 22 inside, wherein the positioning seat 20 is combined with a front cap 23 and a rear cap 24, and the front cap 23 has a dust mirror 25; a first laser module 30, arrange a first tubular body 31 inside the first through hole 21 of the positioning seat 20, the first laser module 30 is provided with a first collimating lens 32 and a first wavelength laser diode 33 inside the first tubular body 31, for emitting laser light of first wavelength, wherein the first tubular body 31 has a first ball unit 311, the first through hole 21 has a first ball and socket unit 211 relative to the first ball unit 311, and a first fixing ring 34 is used to fix the first tubular body 31 to the first through hole 21; a second laser module 40, arrange a second tubular body 41 inside the second through hole 22 of the positioning seat 20, the second laser module 40 is provided with a second collimating lens 42 and a second wavelength laser diode 43 inside the second tubular body 41 for emitting laser light of second wavelength; the second tubular body 41 has a second ball unit 411, the second through hole 22 has a second ball and socket unit 221 relative to the second ball unit 411, and a second fixing ring 44 is used to fix the second tubular body 41 to the inside the second through hole 21; a first reflecting mirror 50, arranged on the positioning seat 20 obliquely with respect to the first laser module 30, and the inner surface of the first reflecting mirror 50 with respect to the first laser module 30 has a first wavelength laser light high-reflection coating 51; and a second reflecting mirror 60, arranged on the positioning seat 20 obliquely with respect to the second laser module 40 and the first reflecting mirror 50, and the outer surface of the second reflecting mirror 60 with respect to the second laser module 40 has a first wavelength laser light high-reflection coating 61 and a second wavelength laser light anti-reflection coating 62.

With the feature disclosed above, after the laser light of the first wavelength passes through the reflection of the first reflecting mirror 50 and the second reflecting mirror 60, it coincides with the optical path of the laser light of the second wavelength which penetrating the second reflecting mirror 60.

Figure 4:
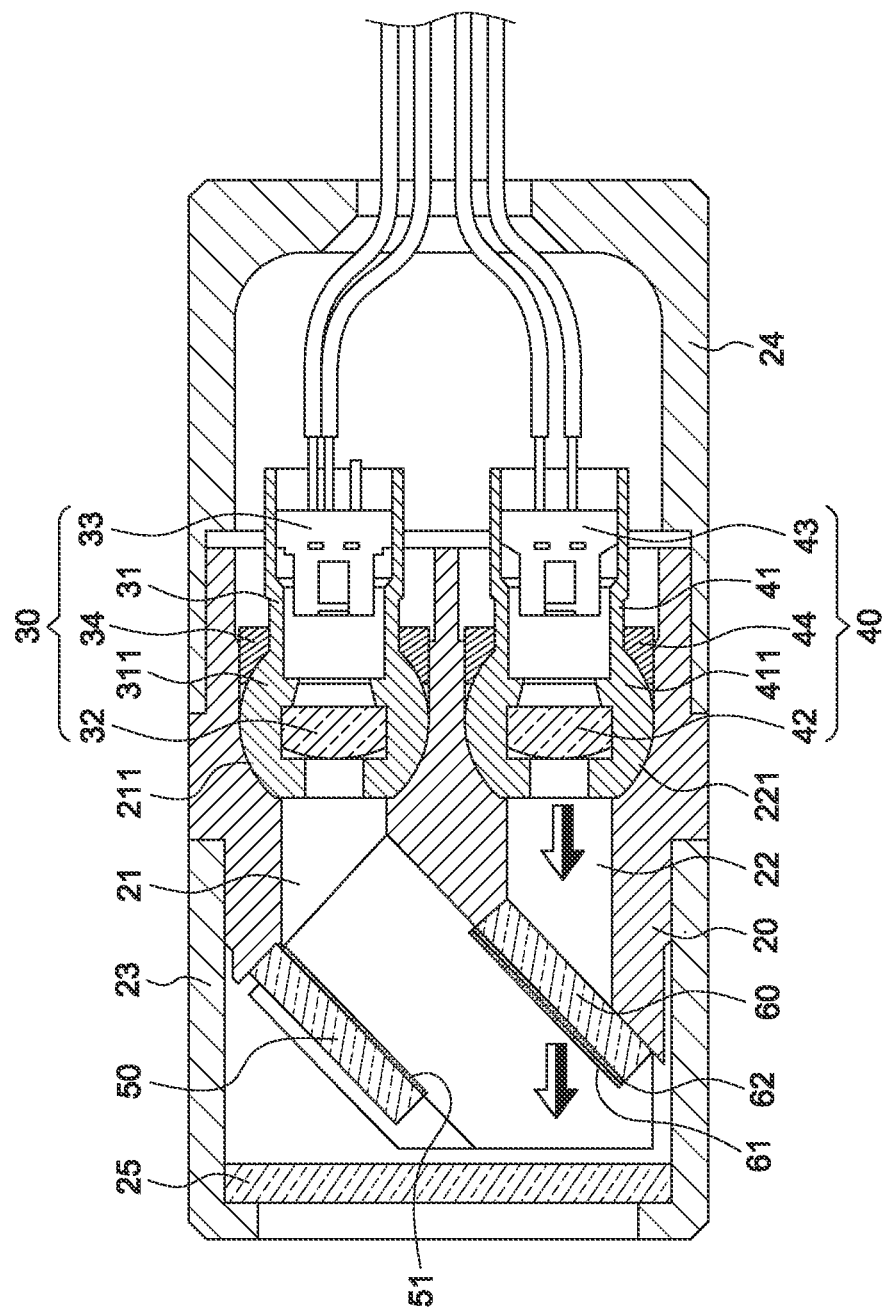
FIG. 4 is the sectional view of the structure of the optical path of the second wavelength of the present invention.

Referring to FIGS. 3~4, when the first laser module 30 is a combination of invisible light (such as infrared light) and the second laser module 40 is a combination of visible light (such as green light); during nighttime use (with night vision goggles), only the first laser is turned on, the optical path of the first laser module 30 will be as shown in FIG. 3; during daytime use, only the second laser is turned on, the optical path of the f second laser module 40 will be as shown in FIG. 4, and there will not produce aiming deviation.

Figure 5:
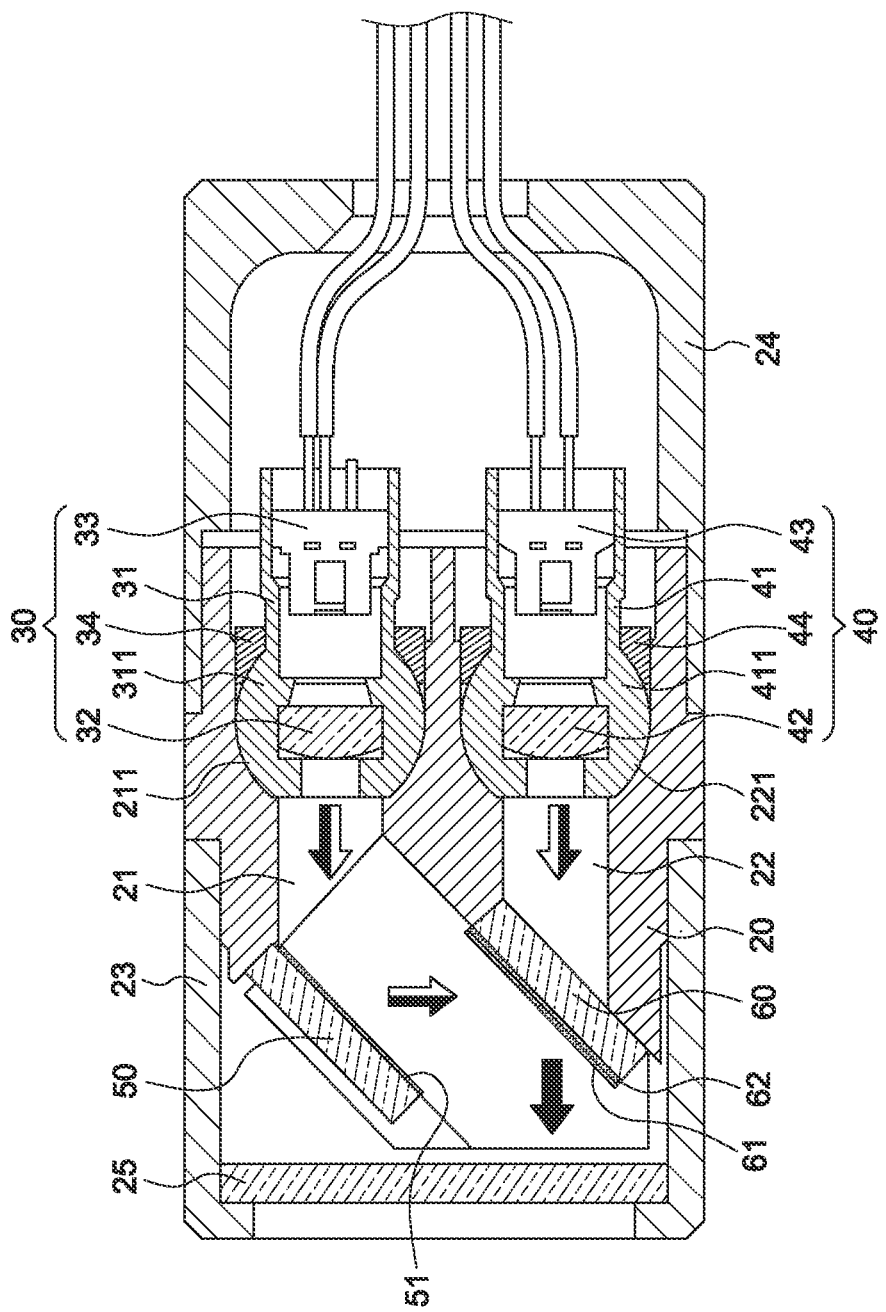
FIG. 5 is the sectional view of the structure of the light blending of the first wavelength and the second wavelength of the present invention.

In addition, when the first laser module 30 is a combination of visible light (such as red light) and the second laser module 40 is a combination of visible light (such as green light); when only turns on the first laser module 30, the first visible light (such as red light) is emitted, when only turns on the second laser module 40, the second visible light (such as green light) is emitted, and when the first laser module 30 and the second laser module 40 are both turned on at the same time, the optical path will be as shown in FIG. 5. The optical paths emitted by the first visible light (such as red light) and the second visible light (such as green light) overlap and mix into the third visible light (such as yellow light), which can be used for achieving light blending effect.

Moreover, the corresponding first ball unit 311 and the first ball-and-socket unit 211 allow the first tubular body 31 of the first laser module 30 to adjust the optical path of the first wavelength laser diode 33 according to the first through hole 21, and then use the first fixing ring 34 to fix the first tubular body 31 in the first through hole 21; Similarly, the optical path of the second wavelength laser diode 43 can also be adjusted; After the optical path is adjusted, it can be ensured that after the first wavelength laser light is reflected by the first reflecting mirror 50 and the second reflecting mirror 60, it will coincide with the optical path of the second wavelength laser light penetrating the second reflecting mirror 60, which is convenient for the effect of light optical adjustment.

What is claimed is:

1. A dual-wavelength gun aiming collimated beam light source module, comprising:
   a positioning seat having a first through hole and a second through hole extending inside said positioning seat substantially in parallel to one another;
   a first laser module arranged inside the first through hole of the positioning seat for emitting laser light of a first wavelength, wherein the first laser module is configured with a first tubular body, and a first collimating lens and a first wavelength laser diode positioned within the first tubular body, wherein the first tubular body has a first ball unit, wherein the first through hole has a first ball and socket unit relative to the first ball unit, and wherein a first fixing ring is used to fix the first tubular body to the first through hole;
   a second laser module arranged inside the second through hole of the positioning seat for emitting laser light of a second wavelength, wherein the second laser module is configured with a second tubular body, and a second collimating lens and a second wavelength laser diode positioned within the second tubular body, wherein the second tubular body has a second ball unit, wherein the second through hole has a second ball and socket unit relative to the second ball unit, and wherein a second fixing ring is used to fix the second tubular body to the second through hole;
   a first reflecting mirror supported by the positioning seat obliquely with respect to the first laser module and the first through hole of the positioning seat, and wherein an inner surface of the first reflecting mirror with respect to the first laser module has a first wavelength laser light high-reflection coating; and
   a second reflecting mirror supported by the positioning seat obliquely with respect to the second laser module and the second through hole of the positioning seat, and wherein an outer surface of the second reflecting mirror with respect to the second laser module has a first wavelength laser light high-reflection coating and a second wavelength laser light anti-reflection coating;
   whereby, after passing through the reflection coatings of the first reflecting mirror and the second reflecting mirror, respectively, the laser light of the first wavelength coincides with the optical path of the laser light of the second wavelength which penetrates the second reflecting mirror.

2. The dual-wavelength gun aiming collimated beam light source module as claimed in claim 1, wherein the positioning seat is combined with a front cap and a rear cap.

3. The dual-wavelength gun aiming collimated beam light source module as claimed in claim 2, wherein the front cap has a dust mirror.

* * * * *